(12) United States Patent
Doi

(10) Patent No.: US 9,288,003 B2
(45) Date of Patent: Mar. 15, 2016

(54) RECEPTION CIRCUIT AND SEMICONDUCTOR INTEGRATED CIRCUIT DEVICE

(71) Applicant: FUJITSU LIMITED, Kawasaki-shi, Kanagawa (JP)

(72) Inventor: Yoshiyasu Doi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/316,418

(22) Filed: Jun. 26, 2014

(65) Prior Publication Data

US 2015/0023459 A1   Jan. 22, 2015

(30) Foreign Application Priority Data

Jul. 18, 2013   (JP) ................. 2013-149634

(51) Int. Cl.
| | | |
|---|---|---|
| H04L 7/00 | (2006.01) | |
| H04J 3/06 | (2006.01) | |
| H03L 7/00 | (2006.01) | |
| H04L 7/033 | (2006.01) | |

(52) U.S. Cl.
CPC ............. *H04J 3/0685* (2013.01); *H03L 7/00* (2013.01); *H04L 7/0025* (2013.01); *H04L 7/033* (2013.01)

(58) Field of Classification Search
CPC ............ H04J 3/07; H04J 3/0685; H03L 7/00; H04L 7/033; H03M 9/00
See application file for complete search history.

(56) References Cited

U.S. PATENT DOCUMENTS

| | | | |
|---|---|---|---|
| 5,043,596 A | 8/1991 | Masuda et al. | |
| 6,970,115 B1 * | 11/2005 | Sardi et al. | 341/100 |
| 7,743,288 B1 * | 6/2010 | Wang | 714/704 |
| 8,035,435 B1 * | 10/2011 | Shringarpure et al. | 327/167 |
| 2003/0222686 A1 * | 12/2003 | Wada et al. | 327/113 |
| 2007/0011534 A1 * | 1/2007 | Boudon et al. | 714/732 |
| 2008/0263381 A1 * | 10/2008 | Khor et al. | 713/500 |
| 2009/0323731 A1 * | 12/2009 | Lee et al. | 370/536 |
| 2011/0221491 A1 * | 9/2011 | Shibasaki et al. | 327/156 |
| 2011/0299585 A1 * | 12/2011 | Tomita et al. | 375/236 |

FOREIGN PATENT DOCUMENTS

| | | |
|---|---|---|
| JP | 2901657 B2 | 6/1999 |
| JP | 2000-201059 A | 7/2000 |

OTHER PUBLICATIONS

Zhou Lei, Wu Danyu, Chen Jianwu, Jin Zhi and Liu Xinyu, "12.5 Gbps 1:16 DEMUX IC with high speed synchronizing circuits", Chinese Academy of Sciences, Journal of Semiconductors, vol. 32, No. 12, Dec. 2011.*

* cited by examiner

*Primary Examiner* — Aristocratis Fotakis
(74) *Attorney, Agent, or Firm* — Arent Fox LLP

(57) ABSTRACT

A reception circuit includes: a plurality of block circuits that each include a phase control circuit that controls a phase of a first clock, and a plurality of internal circuits that are driven by a second clock generated based on the phase-controlled first clock, wherein the phase control circuit in each of the block circuits is controlled by means of a control signal from an operation phase control circuit in such a way that an error rate for reception data due to the plurality of block circuits decreases.

10 Claims, 19 Drawing Sheets

IDEAL DATA SAMPLING TIMING

SLIGHT DEVIATION DUE TO FREQUENCY OFFSET
BETWEEN TRANSMITTER AND RECEIVER

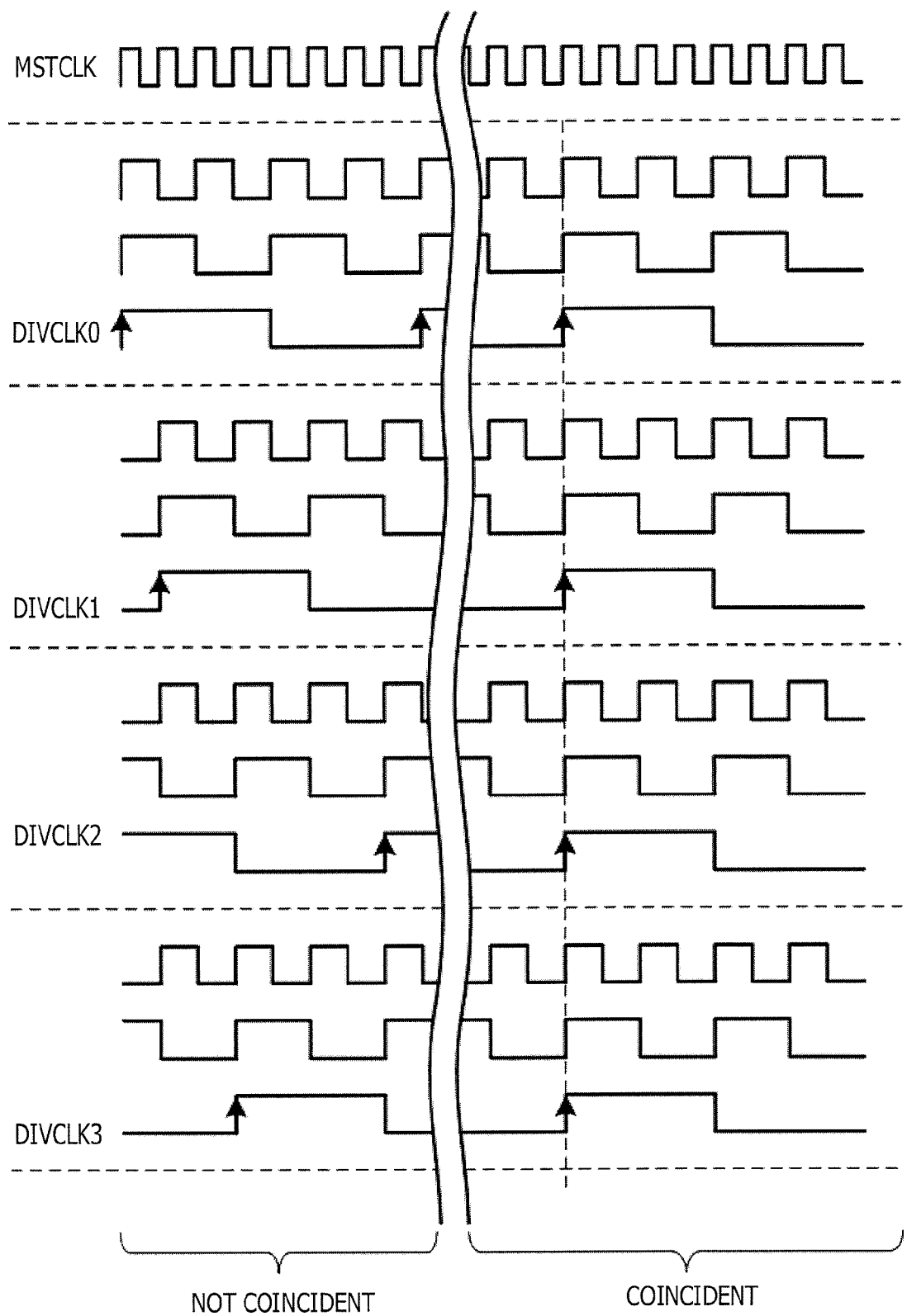

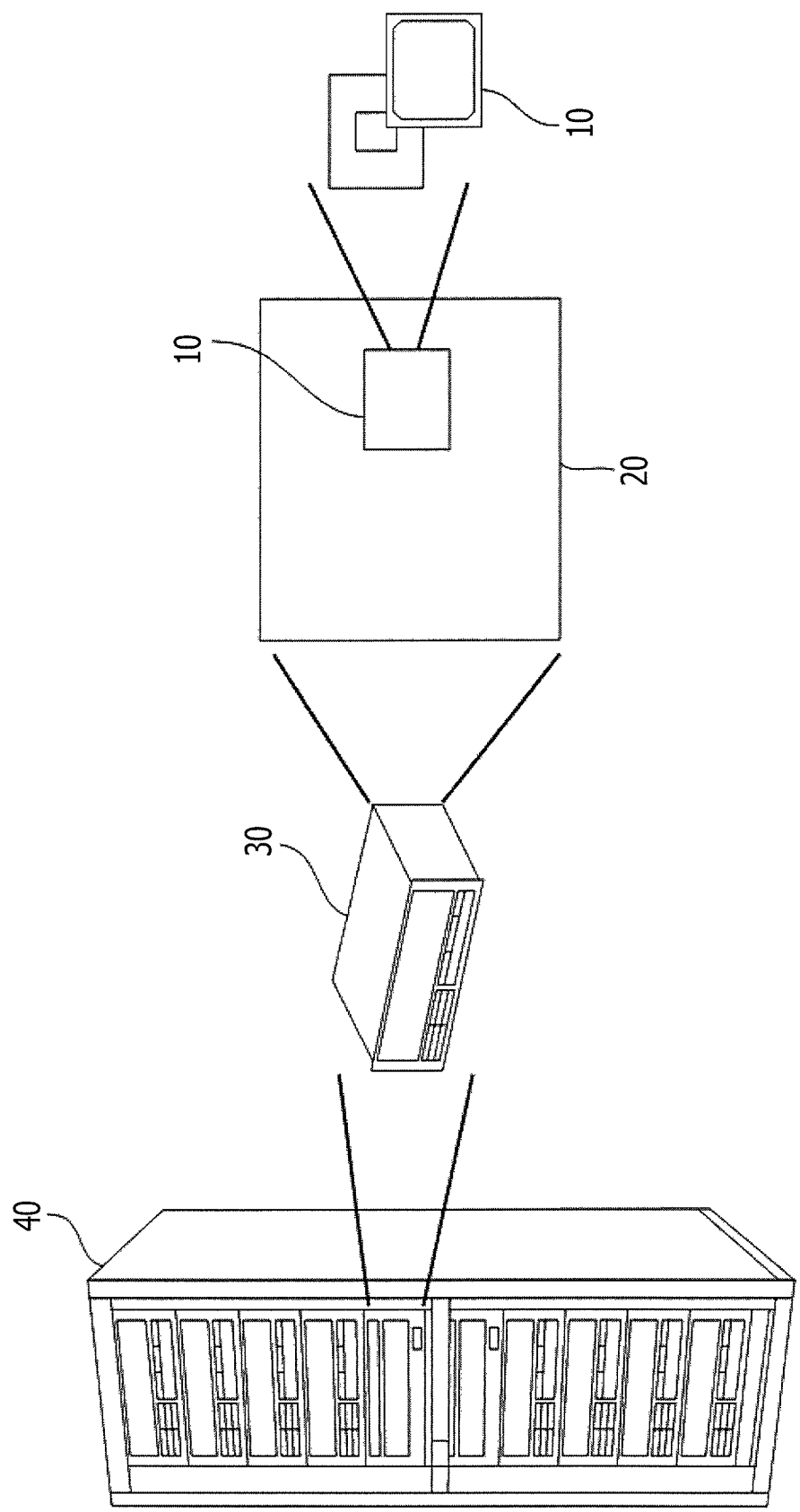

RECEPTION CIRCUIT AND SEMICONDUCTOR INTEGRATED CIRCUIT DEVICE

CROSS-REFERENCE TO RELATED APPLICATION

This application is based upon and claims the benefit of priority from the prior Japanese Patent Application No. 2013-149634 filed on Jul. 18, 2013, the entire contents of which are incorporated herein by reference.

FIELD

The embodiments discussed herein are related to a reception circuit and a semiconductor integrated circuit device.

BACKGROUND

In recent years, together with improvements in the performance of information processing equipment such as devices for communication trunking and servers, the signal transmission/reception data rates within those devices or between devices have also increased. As a reception circuit (RX) that realizes these kinds of high data rates, a system is used in which the phase of a sampling clock is made to follow input data, for example.

To be specific, in the case where a reception circuit receives a 32-Gbps signal for example, because it is difficult for a logic circuit such as a CPU or a DSP to directly process that 32-Gbps signal, signals obtained by conversion into 2-Gbps× 16 parallel signals by the reception circuit are processed.

In addition, for example, digital filter circuits are used, and input data and the sampling timing of a sampling clock are optimally adjusted. As with a CPU or a DSP, it is also difficult for these digital filter circuits to operate at high speed due to being logic circuits, and processing is carried out after parallelization has been carried out.

Moreover, although there are also digital filter circuits that are high-speed in analog, when a very large continuous-time filter is implemented, because a large RC is used for example, it is common for processing to be carried out by means of digital signals.

Furthermore, for example, a reception circuit has also been proposed that generates a master clock by means of a clock generator such as a phase-locked loop (PLL), and distributes that master clock to a plurality of block circuits (for example, CDRs described hereafter) and causes the plurality of block circuits to operate in a parallel manner.

Incidentally, within circuits that distribute a clock to a plurality of block circuits and carry out parallel operation, circuits are conventionally known that adjust clock phases in the block circuits.

Although a reception circuit that distributes a master clock to a plurality of block circuits and causes the plurality of block circuits to operate in a parallel manner has been proposed as previously mentioned, for example, when the clock phases of the plurality of block circuits coincide, internal circuits in those block circuits operate at the same timing and a large current flows.

To be specific, in the case where a reception circuit receives a 32-Gbps signal and outputs signals obtained by conversion into 2-Gbps×16 parallel signals for example, the number of internal circuits that carry out parallel operations by means of a slow clock increases even in one block circuit.

Consequently, for example, in the case where all of the internal circuits in the plurality of block circuits operate at the same timing, a large current momentarily flows and causes power source noise (simultaneous switching noise) to occur. When this kind of noise occurs, for example, it is not possible for data to be correctly determined by the reception circuit, which leads to a rise in the bit error rate (BER).

The following are reference documents.
[Document 1] Japanese Laid-open Patent Publication No. 2000-201059 and
[Document 2] Japanese Patent No. 2901657.

SUMMARY

According to an aspect of the invention, a reception circuit includes: a plurality of block circuits that each include a phase control circuit that controls a phase of a first clock, and a plurality of internal circuits that are driven by a second clock generated based on the phase-controlled first clock, wherein the phase control circuit in each of the block circuits is controlled by means of a control signal from an operation phase control circuit in such a way that an error rate for reception data due to the plurality of block circuits decreases.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6A and FIG. 6B are drawings for illustrating a problem in the reception circuit depicted in FIG. 5;

FIG. 19 is a drawing for illustrating an example in which a semiconductor integrated circuit device depicted in FIG. 18A or FIG. 18B is applied.

DESCRIPTION OF EMBODIMENTS

First, prior to describing embodiments of a reception circuit and a semiconductor integrated circuit in detail, an example of a reception circuit and a problem of that reception circuit are described with reference to FIG. 1 to FIG. 7B.

Figure 1:
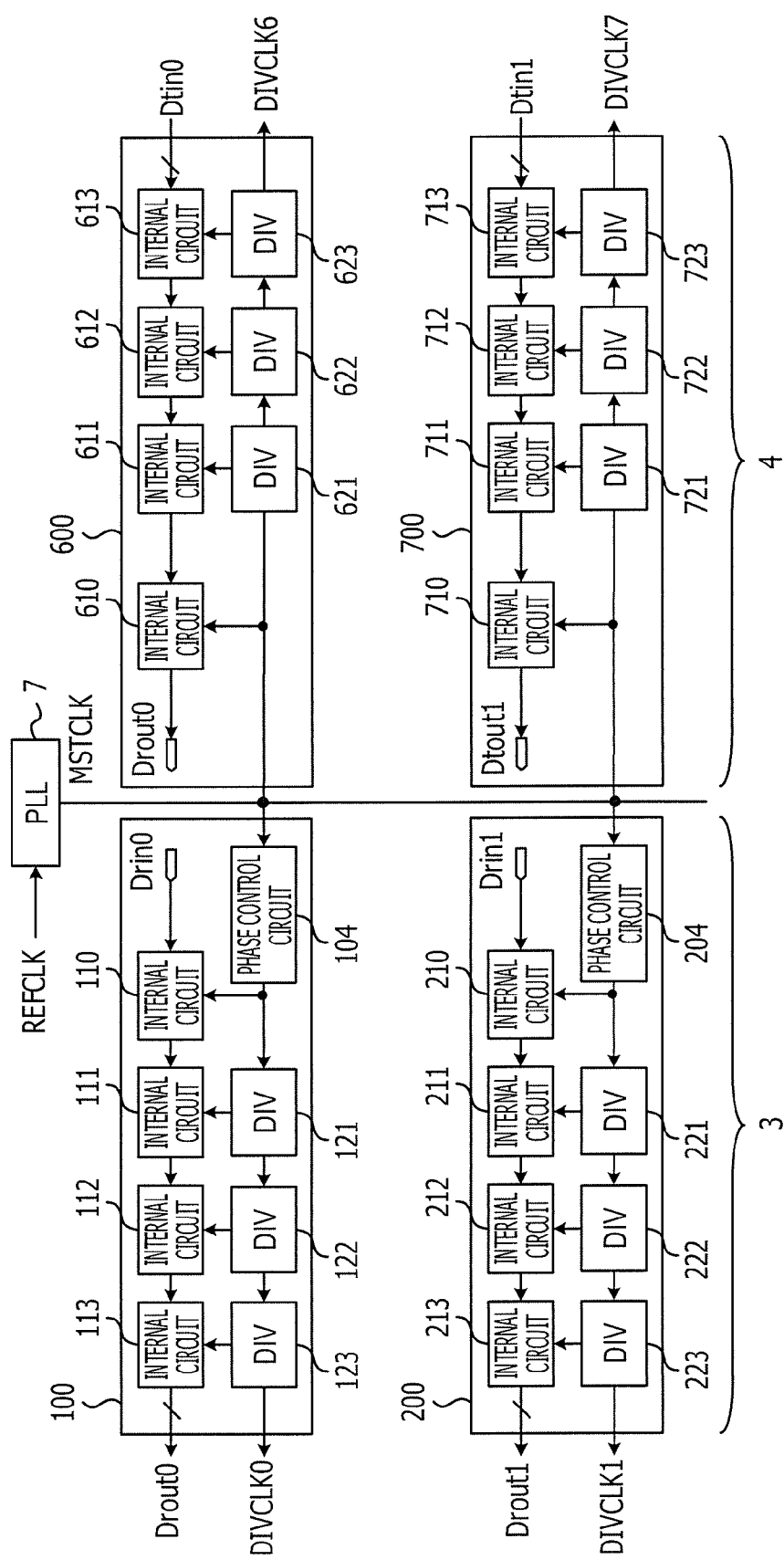
FIG. 1 is a block diagram depicting an example of an input/output circuit.

FIG. 1 is a block diagram depicting an example of an input/output circuit (I/O circuit). In FIG. 1, reference numeral 3 indicates a reception circuit, 4 indicates a transmission circuit, 7 indicates a clock generator, and 100, 200, 600, and 700 indicate block circuits.

Furthermore, reference numerals 110 to 113, 210 to 213, 610 to 613, and 710 to 713 indicate internal circuits, 121 to 123, 221 to 223, 621 to 623, and 721 to 723 indicate frequency dividers (divide-by-2 frequency dividers: DIV), and 104 and 204 indicate phase control circuits.

It ought to be noted that, in FIG. 1, although the clock generator 7 is provided outside of the I/O circuit and is configured as a phase-locked loop (PLL) that receives a reference clock REFCLK and generates a phase-synchronized master clock MSTCLK, the clock generator 7 is not restricted to a PLL.

As depicted in FIG. 1, the I/O circuit includes the reception circuit 3 (reception block circuits 100 and 200) and the transmission circuit 4 (transmission block circuits 600 and 700).

The reception block circuits 100 and 200 include the phase control circuits (phase shifters) 104 and 204 that control the phase of the master clock MSTCLK, the internal circuits 110 to 113 and 210 to 213, and the frequency dividers 121 to 123 and 221 to 223.

Here, the reception block circuits 100 and 200, for example, receive high-bit rate serial reception data signals Drin0 and Drin1 from transmission paths, convert these reception data signals Drin0 and Drin1 into a plurality of low-bit rate parallel data signals Drout0 and Drout1, and output these parallel data signals Drout0 and Drout1 to internal block circuits that process signals.

The transmission block circuits 600 and 700 include the internal circuits 610 to 613 and 710 to 713, and the frequency dividers 621 to 623 and 721 to 723. Moreover, for example, a phase control circuit (phase shifter) may be provided in the final stages of the transmission block circuits 600 and 700 and the timing of transmission data may be adjusted.

Here, the transmission block circuits 600 and 700, for example, receive a plurality of low-bit rate parallel data signals Dtin0 and Dtin1 from internal block circuits, convert these parallel data signals Dtin0 and Dtin1 into high-bit rate serial transmission data signals Dtout0 and Dtout1, and output these transmission data signals Dtout0 and Dtout1 to transmission paths. Moreover, an example of an internal block circuit is a logic circuit such as a CPU or a DSP that processes signals.

Figure 2:
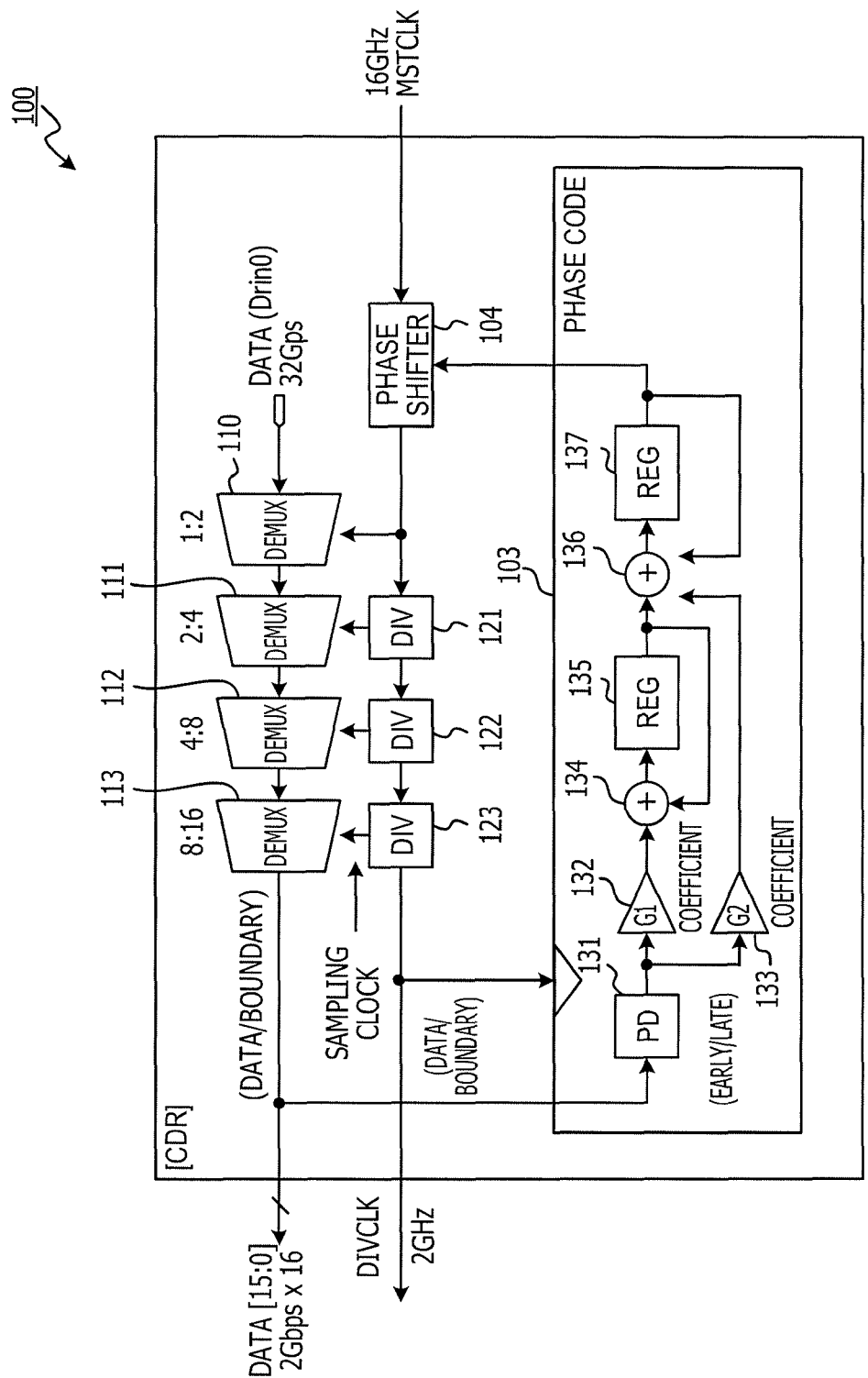
FIG. 2 is a block diagram depicting an example of one block circuit in a reception circuit of the input/output circuit depicted in FIG. 1.

FIG. 2 is a block diagram depicting an example of one block circuit (100) in the reception circuit of the input/output circuit depicted in FIG. 1, and depicts a clock data recovery (CDR) circuit.

As depicted in FIG. 2, the block circuit (CDR) 100 includes a plurality (four) of demultiplexers (DEMUX) 110 to 113, three frequency dividers 121 to 123, a digital filter circuit 103, and a phase shifter 104.

The digital filter circuit 103 is a filter circuit that optimally adjusts the sampling timing between an input data signal Data (for example, Drin0) and a sampling clock (for example, the clock that drives the demultiplexer 110).

In other words, normally, there is a frequency offset at the transmission side and the reception side of a data transmission, and the input phase is variable in accordance with the length of the transmission path, and therefore the reception circuit (CDR 100) adjusts the phase of an internal sampling clock to follow the phase of the input signal Data.

The digital filter circuit 103 includes a phase detector (PD) 131, multipliers 132 and 133, adders 134 and 136, a frequency tracking integrator (REG) 135, and a phase tracking integrator (REG) 137. Here, the multipliers 132 and 133 are for applying coefficients G1 and G2 to input signals (output signals of the phase detector 131) and outputting the results thereof.

The digital filter circuit 103, for example, receives, by means of the phase detector 131, a signal (Data/Boundary) output from the demultiplexer 113, and detects the phase timing (early/late) of that signal in accordance with an output clock (frequency-divided clock DIVCLK).

The detected phase timing is output as a phase code with which the phase shifter 104 is controlled, via the multipliers 132 and 133, the adders 134 and 136, the frequency tracking integrator 135, and the phase tracking integrator 137.

In other words, the phase shifter 104 carries out feedback control in such a way that the phase (shift amount) of the master clock MSTCLK becomes suitable, in accordance with the phase code output from the digital filter circuit 103 (phase tracking integrator 137).

Here, in FIG. 2, the demultiplexer 110, for example, represents one demultiplexer that receives 32-Gbps serial data (Data) and outputs two items of 16-Gbps parallel data. Furthermore, the demultiplexer 111, for example, represents two demultiplexers that receive 16-Gbps serial data and output two items of 8-Gbps parallel data.

In addition, the demultiplexer 112, for example, represents four demultiplexers that receive 8-Gbps serial data and output two items of 4-Gbps parallel data. Moreover, the demultiplexer 113, for example, represents eight demultiplexers that receive 4-Gbps serial data and output two items of 2-Gbps parallel data.

The frequency divider 121, for example, receives the result of the 16-GHz master clock MSTCLK being phase-adjusted by the phase shifter 104, divides the frequency thereof by 2, and outputs an 8-GHz clock to the demultiplexer 111 and the frequency divider 121.

Furthermore, the frequency divider 122, for example, receives the input 8-GHz clock, divides the frequency thereof by 2, and outputs a 4-GHz clock to the demultiplexer 112 and the frequency divider 123. Then, the frequency divider 123, for example, receives the input 4-GHz clock, divides the frequency thereof by 2, and outputs a 2-GHz clock to the demultiplexer 113 and also to outside as the frequency-divided clock DIVCLK.

Here, the demultiplexers 110 to 113, for example, are configured to operate at both the rising edge and the falling edge of the clocks (sampling clocks) from the phase shifter 104 and the frequency dividers 121 to 123.

In this way, for example, it is possible for 32-Gbps serial data to be converted into 2-Gbps×16 parallel data (Data [15: 0]) and output. It ought to be noted that the communication speed of the above-mentioned data, the frequency of the clocks, and the configuration of the demultiplexers and the frequency dividers are merely examples and may be altered in a variety of ways.

Figure 3A:
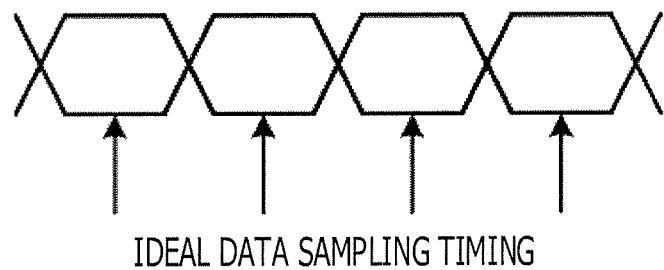
FIG. 3A and FIG. 3B are drawings for illustrating a deviation in the data sampling timing in the CDR depicted in FIG. 2.
Figure 3B:
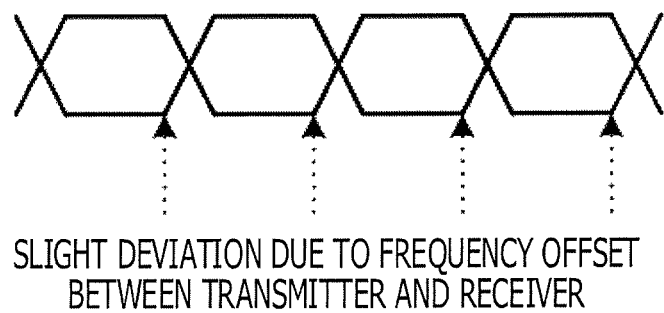

FIG. 3A and FIG. 3B are drawings for illustrating a deviation in the data sampling timing in the CDR depicted in FIG. 2. Here, FIG. 3A depicts the ideal data sampling timing (the case where the sampling timing is in the center of the data eyes), and FIG. 3B depicts the case where the data sampling timing has deviated.

Here, the change in the data sampling timing from the ideal state such as that in FIG. 3A to that in FIG. 3B is, for example, caused by a slight deviation in the data sampling timing due to the frequency offset between transmitter and receiver.

Moreover, it goes without saying that the deviation in the data sampling timing arises due to various other conditions such as changes in the operating speed of a semiconductor element due to the parasitic capacitance of a transmission line and the environmental temperature.

Figure 4A:
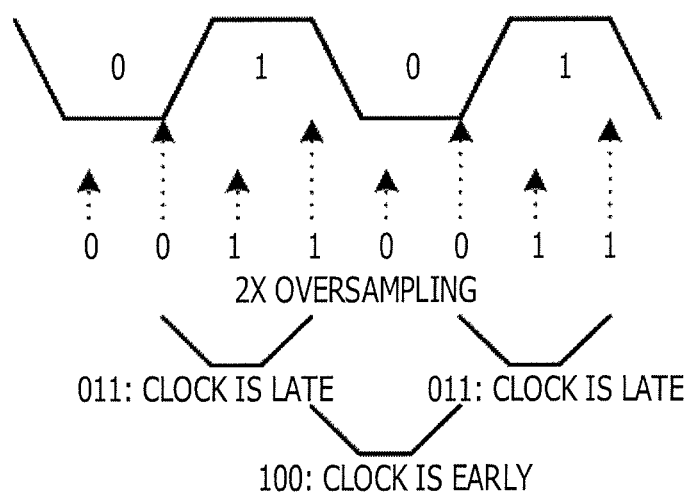
FIG. 4A and FIG. 4B are drawings for illustrating the operation of a phase detector in the CDR depicted in FIG. 2.
Figure 4B:
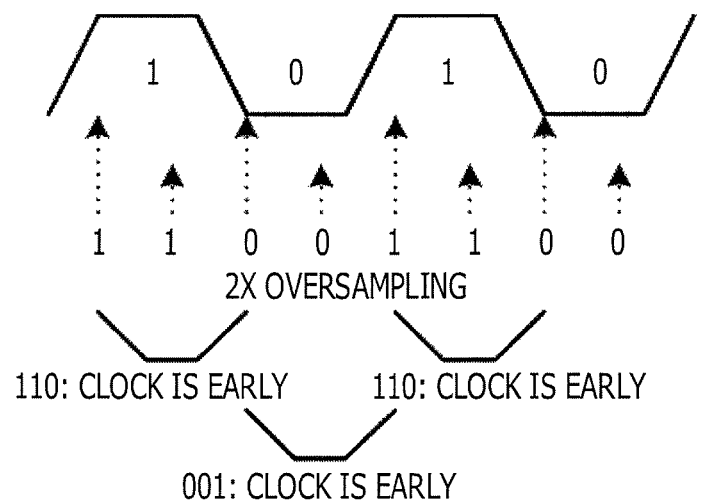

FIG. 4A and FIG. 4B are drawings for illustrating the operation of the phase detector 131 in the CDR depicted in FIG. 2, and illustrate the way in which the phase relationship between data and a clock is detected by means of 2× oversampling.

Here, FIG. 4A depicts the case where a clock (for example, transition timing for a 2-GHz frequency-divided clock DIVCLK) is behind data (for example, sampling timing suitable for one item of 2-Gbps data in Data [15:0]) (late). Furthermore, FIG. 4B depicts the case where a clock is ahead of data (early).

As depicted in FIG. 4A, for example, in the case where sampling is carried out by means of an oversampling clock having a frequency (4 GHz) twice that of the clock (2 GHz), if the clock is behind the data, the sampled data becomes "011", "100", "011".

Conversely, as depicted in FIG. 4B, for example, if the oversampling clock is ahead of the data, the sampled data becomes "110", "001", "110".

The phase detector 131 uses this to detect the phase relationship (early/late) between a clock and data, and feedback control is performed with which the phase of the master clock MSTCLK is adjusted in such a way that the phase relationship between the clock (DIVCLK) and the data becomes suitable.

Figure 5:
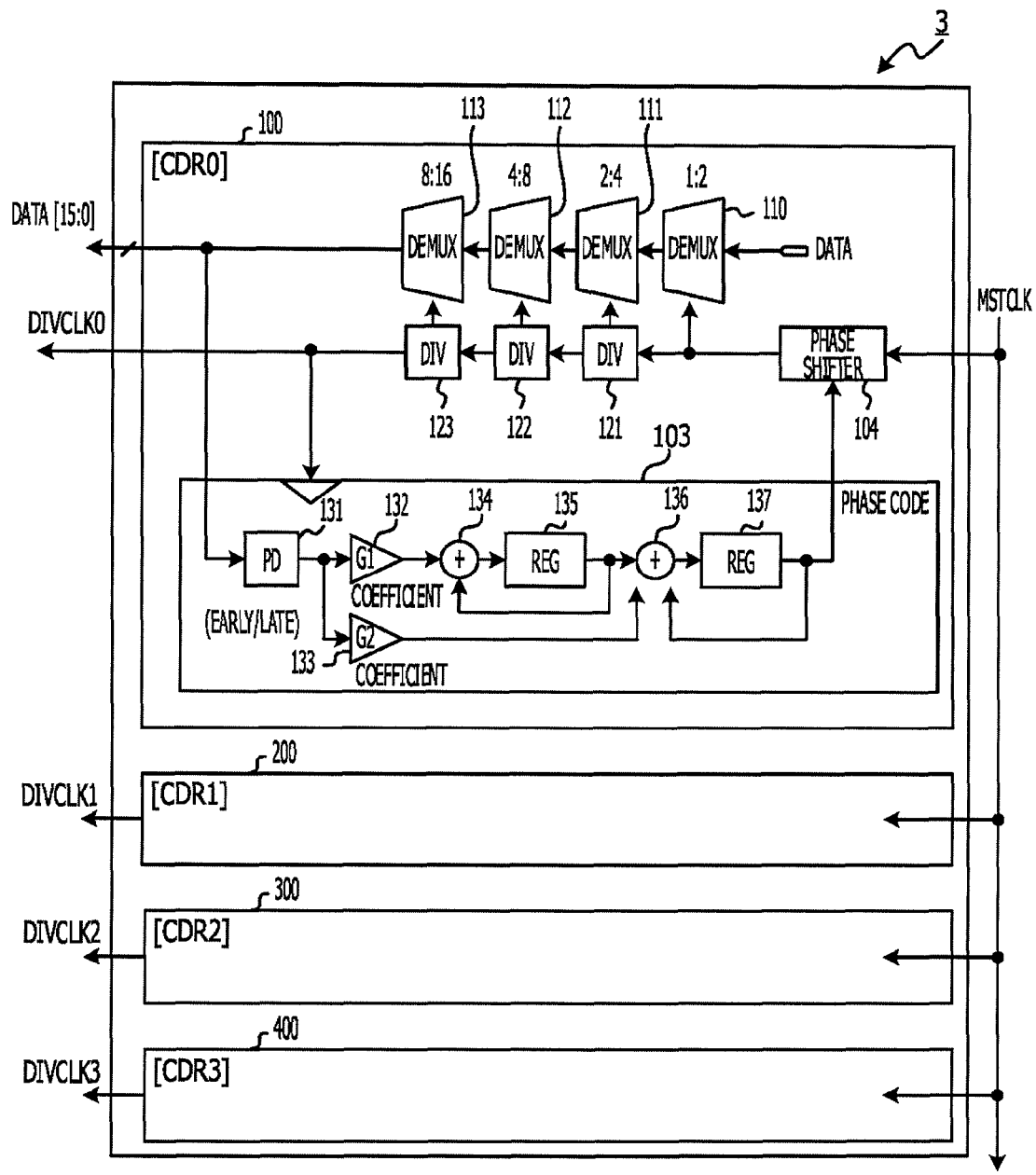
FIG. 5 is a block diagram depicting another example of a reception circuit.

FIG. 5 is a block diagram depicting another example of the reception circuit 3, in which four (CDR0 to CDR3) of the CDRs described with reference to FIG. 2 are provided. In other words, CDR0 to CDR3 have a configuration that is the same as the CDR (internal circuit) 100 described with reference to FIG. 2.

FIG. 6A and FIG. 6B are drawings for illustrating a problem in the reception circuit depicted in FIG. 5. Here, FIG. 6A on the left side, for example, depicts the case where the transition timings (for example, the rising edge timings) of the frequency-divided clocks DIVCLK0 to DIVCLK3 of the four block circuits 100 to 400 (CDR0 to CDR3) do not coincide.

Furthermore, FIG. 6B on the right side, for example, depicts the case where the transition timings of the frequency-divided clocks DIVCLK0 to DIVCLK3 of the four block circuits 100 to 400 coincide.

Incidentally, as described with reference to FIG. 2, in one block circuit (CDR) 100, for example, the DEMUX 113 driven by a 2-GHz frequency-divided clock represents eight demultiplexers, and therefore these eight demultiplexers operate simultaneously.

Consequently, for example, as depicted in FIG. 6A, when the transition timings of the four frequency-divided clocks DIVCLK0 to DIVCLK3 do not coincide, for example, the eight demultiplexers in each of the block circuits 100 to 400 operate simultaneously at different timings.

In contrast to this, for example, as depicted in FIG. 6B, when the transition timings of the four frequency-divided clocks DIVCLK0 to DIVCLK3 coincide, for example, all (32) of the demultiplexers of the block circuits 100 to 400 operate at the same timing.

Naturally, the DEMUX 112 in which four demultiplexers operate in a parallel manner and the DEMUX 111 in which two demultiplexers operate in a parallel manner are also included as well as the DEMUX 113 in which the highest number of eight demultiplexers operate in a parallel manner, and each DEMUX 110 to 113 operates at the same timing. Then, if the transition timings of the frequency-divided clocks DIVCLK0 to DIVCLK3 coincide, all of the internal circuits in all of the block circuits 100 to 400 operate simultaneously.

In other words, feedback control is carried out individually in the phase shifters (104) in the CDRs (block circuits 100 to 400), and therefore, for example, the transition timings of the frequency-divided clocks DIVCLK0 to DIVCLK3 also become individual timings.

Consequently, for example, as depicted in FIG. 6B, when the transition timings of all of the frequency-divided clocks DIVCLK0 to DIVCLK3 coincide, the plurality of circuits controlled by those frequency-divided clocks operate simultaneously and a large current momentarily flows, which causes power source noise to occur.

This not only occurs in circuits that are driven by the frequency-divided clocks DIVCLK0 to DIVCLK3 in the final stage, but, for example, also occurs in circuits and so forth controlled by the output clock of the frequency divider 122, and if a large number of circuits operate simultaneously, noise may be generated.

In addition, even if the transition timings of all of the frequency-divided clocks do not coincide, the same problem occurs if the transition timings of a plurality of clocks coincide, or if the transition timings more or less coincide despite slight deviations.

In this way, for example, in a reception circuit, as the frequency becomes slower, because parallelization is carried out for data signals, the number of circuits that operate at corresponding frequencies increases, and a large spike noise (simultaneous switching noise: SSN) is liable to occur.

In other words, although circuits that operate at slow frequencies have low power consumptions themselves, for example, because these circuits operate concurrently at the moment the clocks change, a large spike noise is caused in the power source.

Incidentally, the data signals Data input to the reception circuit (100) are very susceptible to noise because a very low amplitude is used and, furthermore, the phase shifter 104 used for adjusting the phases of internal clocks also handles low-amplitude signals.

Therefore, for example, if the power source voltage momentarily fluctuates to a considerable extent due to simultaneous switching noise, it becomes difficult for the "0s" and "1s" of the reception data to be correctly determined, which leads to a rise in the bit error rate (BER).

Figure 7A:
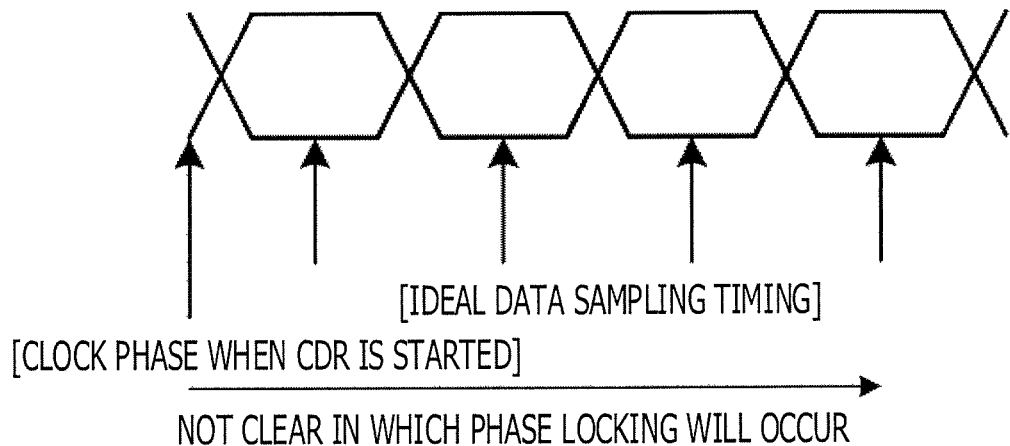
FIG. 7A and FIG. 7B are drawings for illustrating a problem in the reception circuits depicted in FIG. 2 and FIG. 5.
Figure 7B:
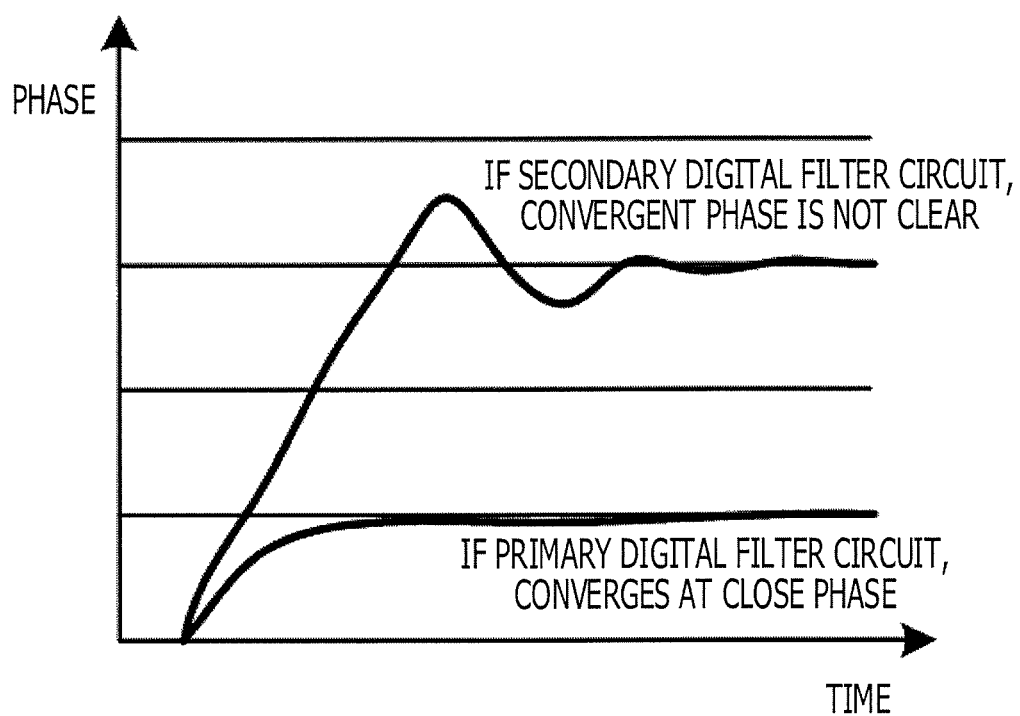

FIG. 7A and FIG. 7B are drawings for illustrating a problem in the reception circuits depicted in FIG. 2 and FIG. 5, FIG. 7A is a drawing for illustrating the clock phase when a CDR starts operating, and FIG. 7B is a drawing for illustrating the convergent phase in the case of a primary digital filter circuit and in the case of a secondary digital filter circuit.

As depicted in FIG. 2 and FIG. 5, the frequency tracking integrator (REG) 135 and the phase tracking integrator (REG) 137 are provided in the digital filter circuit 103 in each CDR 100, and constitute a secondary filter.

As depicted in FIG. 7A, although the ideal data sampling timing is more or less in the center of each data eye, when the CDR 100 starts operating for example, it is not clear in which phase the clock phase will lock.

In other words, as depicted in FIG. 7B, because the CDR 100 is realized using a secondary filter, it is difficult to predict where the phase after convergence of the CDR loop will be. In other words, in the initialization sequence, even if timing adjustment for frequency-divided clocks is performed in order to suppress simultaneous switching noise, the timing is changed once again due to the CDR function.

Moreover, convergence occurs at a close phase if the digital filter circuit of a CDR is a primary digital filter circuit rather than a secondary digital filter circuit; however, it is difficult to obtain sufficient accuracy when a primary digital filter circuit is applied.

Figure 8:
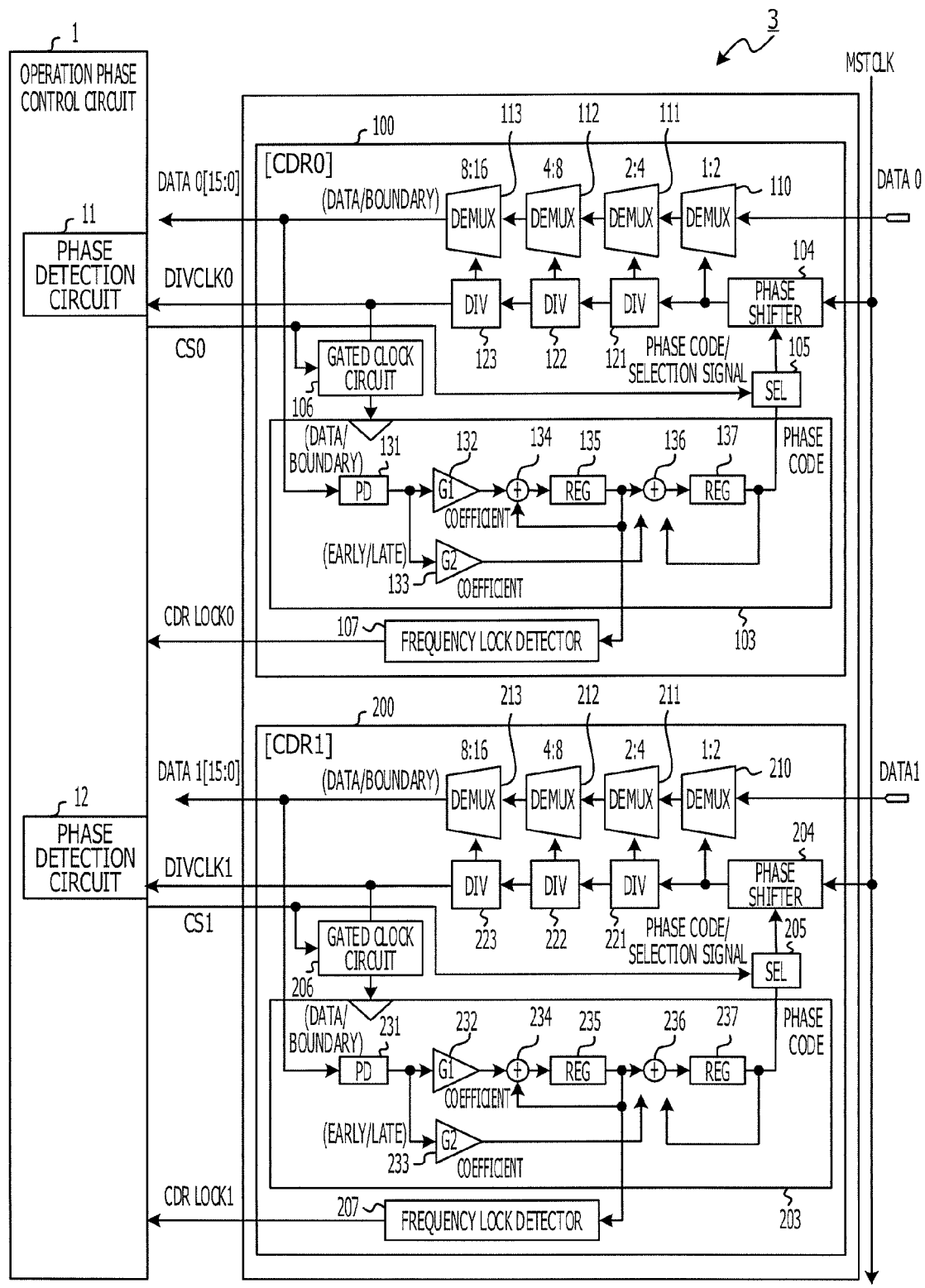
FIG. 8 is a block diagram depicting a reception circuit of a first embodiment.
Figure 9:
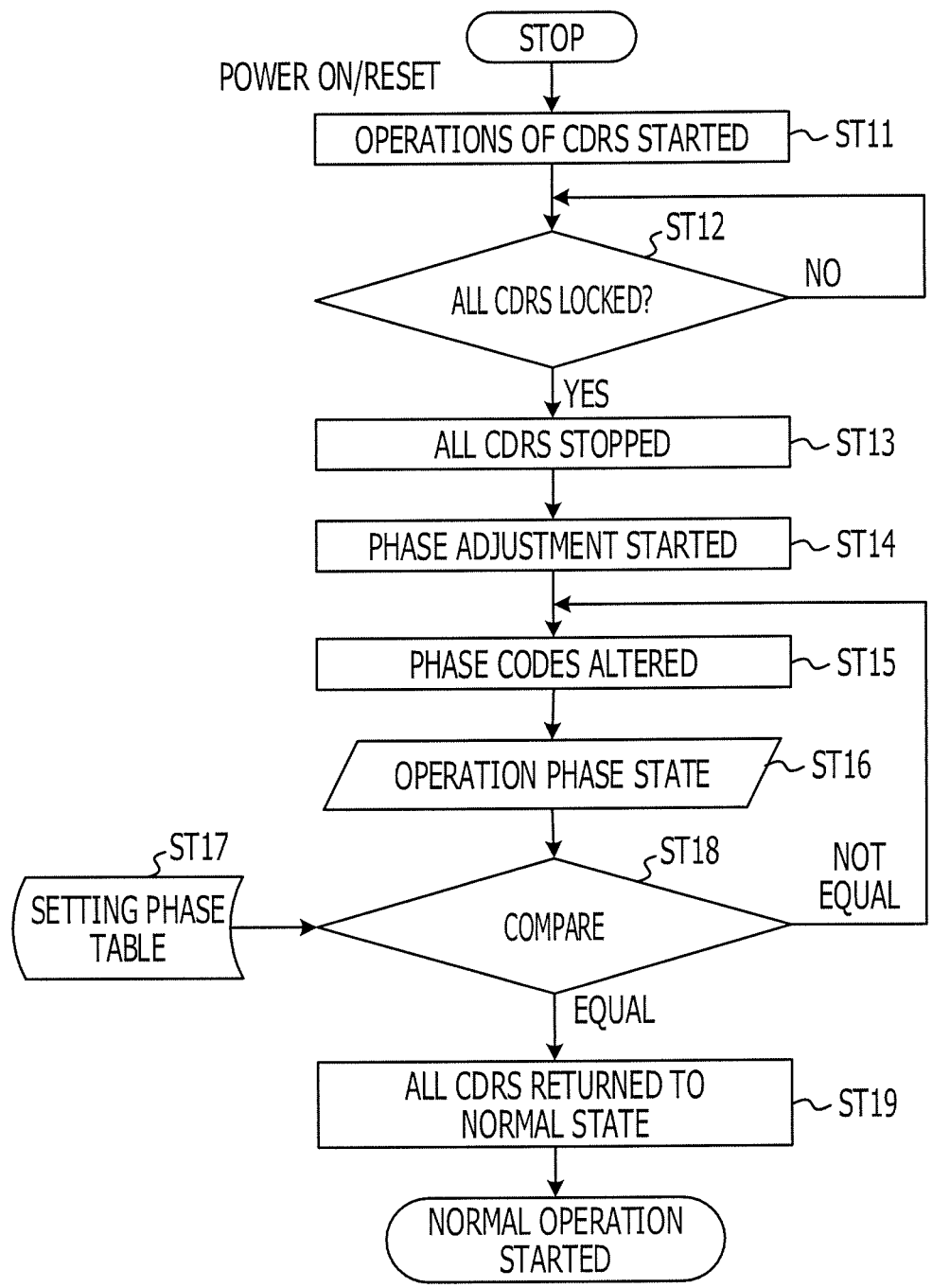
FIG. 9 is a flowchart for illustrating an example of the operation of the reception circuit depicted in FIG. 8.

Hereafter, the reception circuit and the semiconductor integrated circuit device of the present embodiment are described in detail with reference to the appended drawings. FIG. 8 is a block diagram depicting a reception circuit of a first embodiment, and FIG. 9 is a flowchart for illustrating an example of the operation of the reception circuit depicted in FIG. 8.

As is apparent from a comparison between FIG. 8 and the aforementioned FIG. 2 and FIG. 5, in the reception circuit of the first embodiment, the block circuits 100 and 200 further include selectors (SEL) 105 and 205, gated clock circuits 106 and 206, and frequency lock detectors 107 and 207.

In order to simplify the description, the reception circuit of the first embodiment depicted in FIG. 8 includes the two block circuits 100 and 200 (CDR0 and CDR1) having the same configuration; however, the number of block circuits is not restricted to two, and there may be even more block circuits.

Moreover, the demultiplexers 110 to 113 and 210 to 213, the frequency dividers 121 to 123 and 221 to 223, the digital filter circuits 103 and 203, and the phase shifters 104 and 204 are the same as those described with reference to FIG. 2, and descriptions thereof have been omitted.

Here, an operation phase control circuit 1, for example, may also be used as a circuit that processes data signals (Data0 [15:0] and Data1 [15:0]) received from the reception circuit 3 (100 and 200), a CPU or a DSP for example, or may be used as a dedicated processing circuit.

The operation phase control circuit 1 includes a phase detection circuit 11 that receives an output clock (frequency-divided clock) DIVCLK0 from the block circuit 100 and detects the phase thereof, and a phase detection circuit 12 that receives an output clock DIVCLK1 from the block circuit 200 and detects the phase thereof.

Furthermore, the operation phase control circuit 1 receives an output signal (CDR Lock0) from the frequency lock detector 107, which detects a CDR lock, in the block circuit 100, and an output signal (CDR Lock1) from a frequency lock detector 207 in the block circuit 200.

Here, the frequency lock detectors 107 and 207 detect, by means of the output of the frequency tracking integrators (REG) 135 and 235, whether the frequency-divided clocks DIVCLK0 and DIVCLK1 have locked.

In addition, when CDR locks in all of the block circuits 100 and 200 are detected, the operation phase control circuit 1 outputs control signals CS0 and CS1 with which the gated clock circuits 106 and 206 and the frequency lock detectors 107 and 207 are controlled.

In other words, the selectors 105 and 205 control phase codes applied to the phase shifters 104 and 204, in accordance with the control signals CS0 and CS1 from the operation phase control circuit 1. Furthermore, the gated clock circuits (operation control circuits) 106 and 206 control the operation of the digital filter circuits 103 and 203 in accordance with the control signals CS0 and CS1 from the operation phase control circuit 1.

As depicted in FIG. 9, for example, when powering on is performed from a stopped state in which the power source of the reception circuit is off, or when a reset is performed while the reception circuit is operating, the processing of the reception circuit of the present embodiment starts, and the processing of step ST11 is carried out. In other words, the processing for the starting of the reception circuit of the present embodiment is, for example, carried out as initialization processing when power is supplied to the device in which the reception circuit is provided, or as reset processing.

First, in step ST11, the processing performed by the CDRs (block circuits 100 and 200) starts, processing advances to step ST12, waits until it is determined that a CDR lock has been performed by all of the block circuits 100 and 200, and then processing advances to step ST13.

In step ST12, when it is determined that a CDR lock has been performed by all of the block circuits 100 and 200, processing advances to step ST13, and all of the CDRs are stopped. In other words, the operation phase control circuit 1 controls the gated clock circuits 106 and 206 by means of the control signals CS0 and CS1 and stops the digital filter circuits 103 and 203.

Next, processing advances to step ST14 and phase adjustment is started, and, in addition, processing advances to step ST15 and phase codes are altered. In other words, the operation phase control circuit 1 controls the selectors 105 and 205 by means of the control signals CS0 and CS1, and carries out phase adjustment by altering the phase codes that are output to the phase shifters 104 and 204.

Processing then advances to step ST16 and the operation phase state is acquired, processing advances to step ST18, reference is made to a setting phase table (ST17), and a comparison is performed as to whether the operation phase state has become the state set in the setting phase table.

In other words, the operation phase control circuit 1 repeats the phase code alteration processing from step ST15 until the phases of the frequency-divided clocks DIVCLK0 and DIVCLK1 of the block circuits 100 and 200 become the phases set in the setting phase table according to the phase detection circuits 11 and 12.

Here, assuming that the internal circuits in the block circuits operate at the rising edge timings of the clocks, the phase (phase difference) set in the setting phase table is, for example, set to 180° at which the phases of the two frequency-divided clocks DIVCLK0 and DIVCLK1 are furthest apart.

Furthermore, regarding the phase differences set in the setting phase table, in the case where there are four block circuits, the phase difference of the four frequency-divided clocks of the block circuits is set to 90°, and, in addition, in the case where there are six block circuits, the phase difference of the six frequency-divided clocks of the block circuits is set to 60°.

In other words, the phase difference set in the setting phase table is set in such a way that simultaneous switching noise does not occur due to the rising edge timings (transition timings) of the frequency-divided clocks of the block circuits being coincident, in other words, that the transition timings vary.

Then, when the phases of the frequency-divided clocks DIVCLK0 and DIVCLK1 become the phase set in the setting phase table, processing advances to step ST19, and all of the CDRs are returned to a normal state.

In other words, in step ST18, when it is determined that the phases of the frequency-divided clocks DIVCLK0 and DIVCLK1 of the block circuits 100 and 200 have become the phase set in the setting phase table, processing proceeds to step ST19, and the reception operation performed by the reception circuit 3 (100 and 200) is started.

Thus, because the transition timings of the frequency-divided clocks of the block circuits become different timings that do not coincide, simultaneous switching noise is suppressed, and it is possible for the bit error rate to be reduced.

Figure 10:
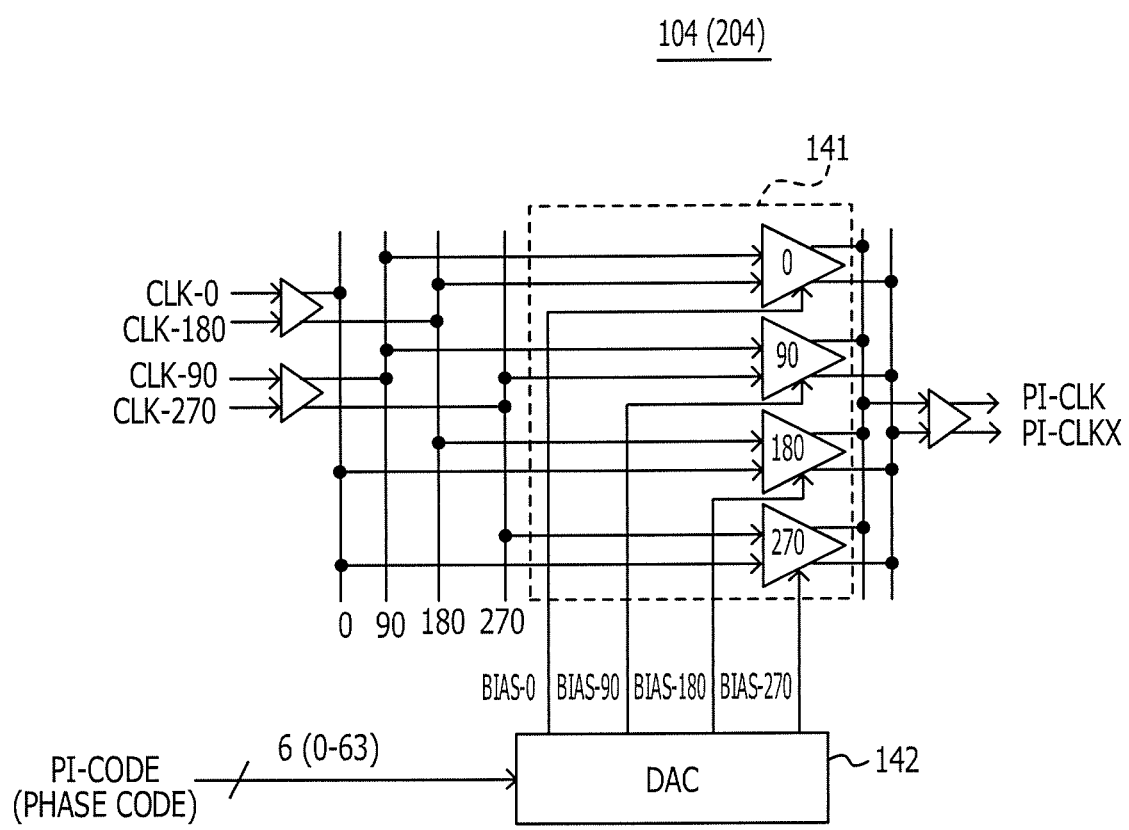
FIG. 10 is a block diagram depicting an example of a phase shifter in the reception circuit depicted in FIG. 8.

FIG. 10 is a block diagram depicting an example of the phase shifter 104 (204) in the reception circuit depicted in FIG. 8, and depicts a phase interpolator. Furthermore, FIG. 11 is a drawing for illustrating the operation of the phase shifter depicted in FIG. 10.

As depicted in FIG. 10, the phase shifter 104 includes a mixer 141, a digital-analog converter (DAC) 142, and a differential buffer and so forth.

Figure 11:
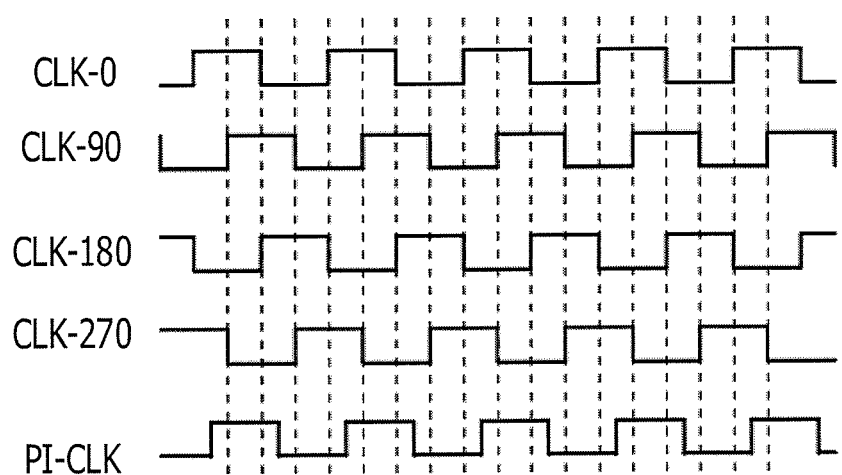
FIG. 11 is a drawing for illustrating the operation of the phase shifter depicted in FIG. 10.

As depicted in FIG. 10 and FIG. 11, the phase shifter 104 generates clocks (PI-CLK and PI-CLKX) of an intermediate phase corresponding to a phase code (PI-CODE) from two clocks (quadriphase clocks) CLK-0, CLK-90, CLK-180, and CLK-270 in which the phase differs by 90° at the same frequency, and outputs the intermediate-phase clocks. Here, the clock PI-CLKX represents a clock having the inverse logic (reverse phase) of the clock PI-CLK.

Moreover, by setting the phase code (PI-CODE) as 6 bits (0 to 63) and changing this phase code, weightings (BIAS-0, BIAS-90, BIAS-180, and BIAS-270) for the quadriphase clocks CLK-0, CLK-90, CLK-180, and CLK-270 are adjusted and the phase of the clock PI-CLK is controlled. Furthermore, FIG. 10 and FIG. 11 are merely examples of the phase shifter 104 (204), and it is possible for various other phase shifters to be applied.

Figure 12:
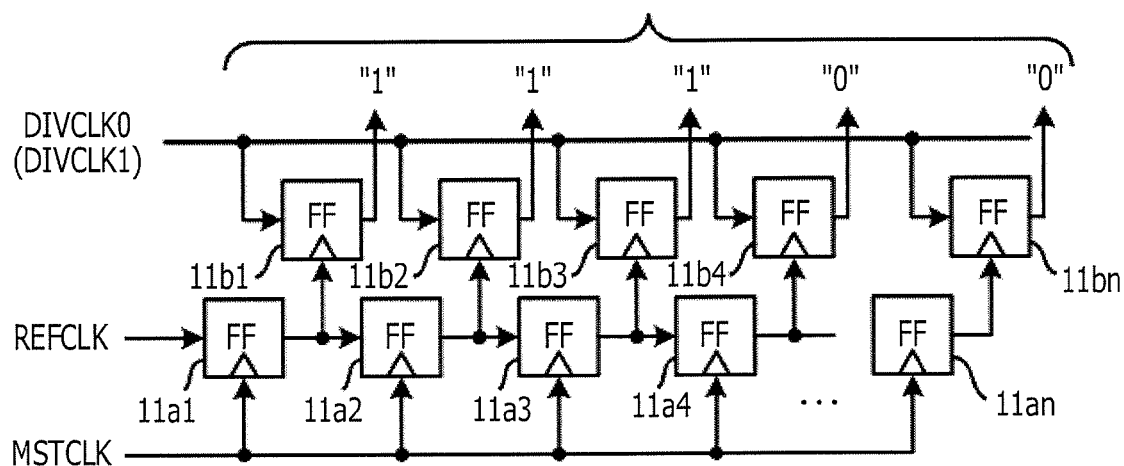
FIG. 12 is a block diagram depicting an example of a phase detection circuit in the reception circuit depicted in FIG. 8.
Figure 13:
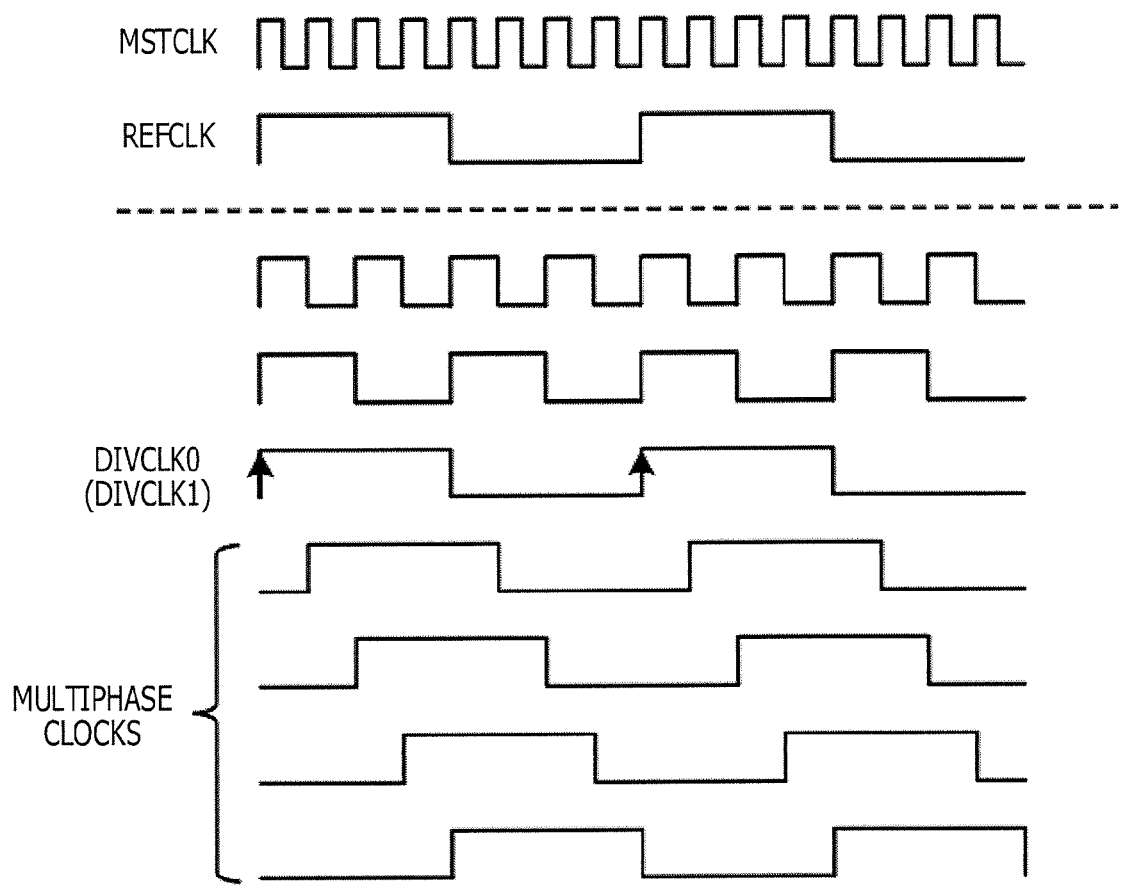
FIG. 13 is a drawing for illustrating the operation of the phase detection circuit depicted in FIG. 12.

FIG. 12 is a block diagram depicting an example of the phase detection circuit 11 (12) in the reception circuit depicted in FIG. 8, and FIG. 13 is a drawing for illustrating the operation of the phase detection circuit depicted in FIG. 12.

As depicted in FIG. 12, the phase detection circuit 11 includes a plurality of flip-flops (FF) 11a1 to 11an in which the master clock MSTCLK is input to a clock terminal, and a plurality of flip-flops 11b1 to 11bn to which the frequency-divided clock DIVCLK0 is input.

The flip-flops 11a1 to 11an are cascade connected, the first-stage flip-flop 11a1 has a reference clock REFCLK input thereto, and subsequent-stage flip-flops (for example, FF11a3) have an output signal from the previous-stage flip-flop (for example, FF11a2) input thereto.

The flip-flops 11b1 to 11bn receive, at clock terminals, output signals (multiphase clocks) from the corresponding flip-flops 11a1 to 11an, and acquire the frequency-divided clock DIVCLK0 in accordance with those output signals from the flip-flops 11a1 to 11an.

Here, as depicted in FIG. 13, the output signals (multiphase clocks) from the flip-flops 11a1 to 11an are clocks that have been delayed in accordance with the master clock MSTCLK.

Consequently, by perceiving which of the flip-flops 11b1 to 11bn outputs "1", in other words, by perceiving the boundary between the flip-flops (11b1 to 11b3) that output "1" and the flip-flop (11b4 that outputs "0", the phase of the frequency-divided clock DIVCLK0 is detected. It ought to be noted that FIG. 12 and FIG. 13 are merely examples of the phase detection circuit 11 (12), and it goes without saying that it is possible for various other phase detection circuits to be applied.

Figure 14:
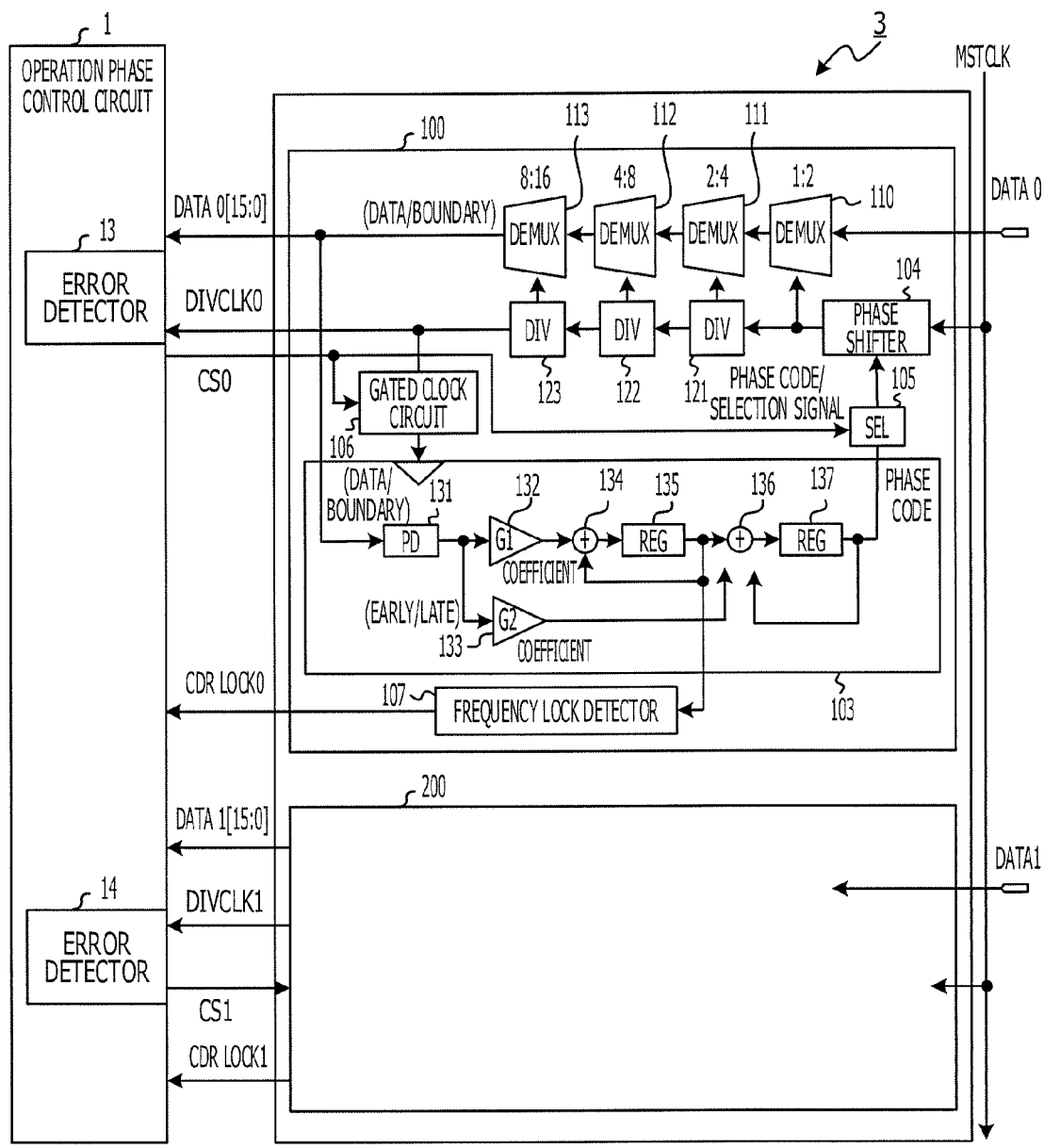
FIG. 14 is a block diagram depicting a reception circuit of a second embodiment.
Figure 15:
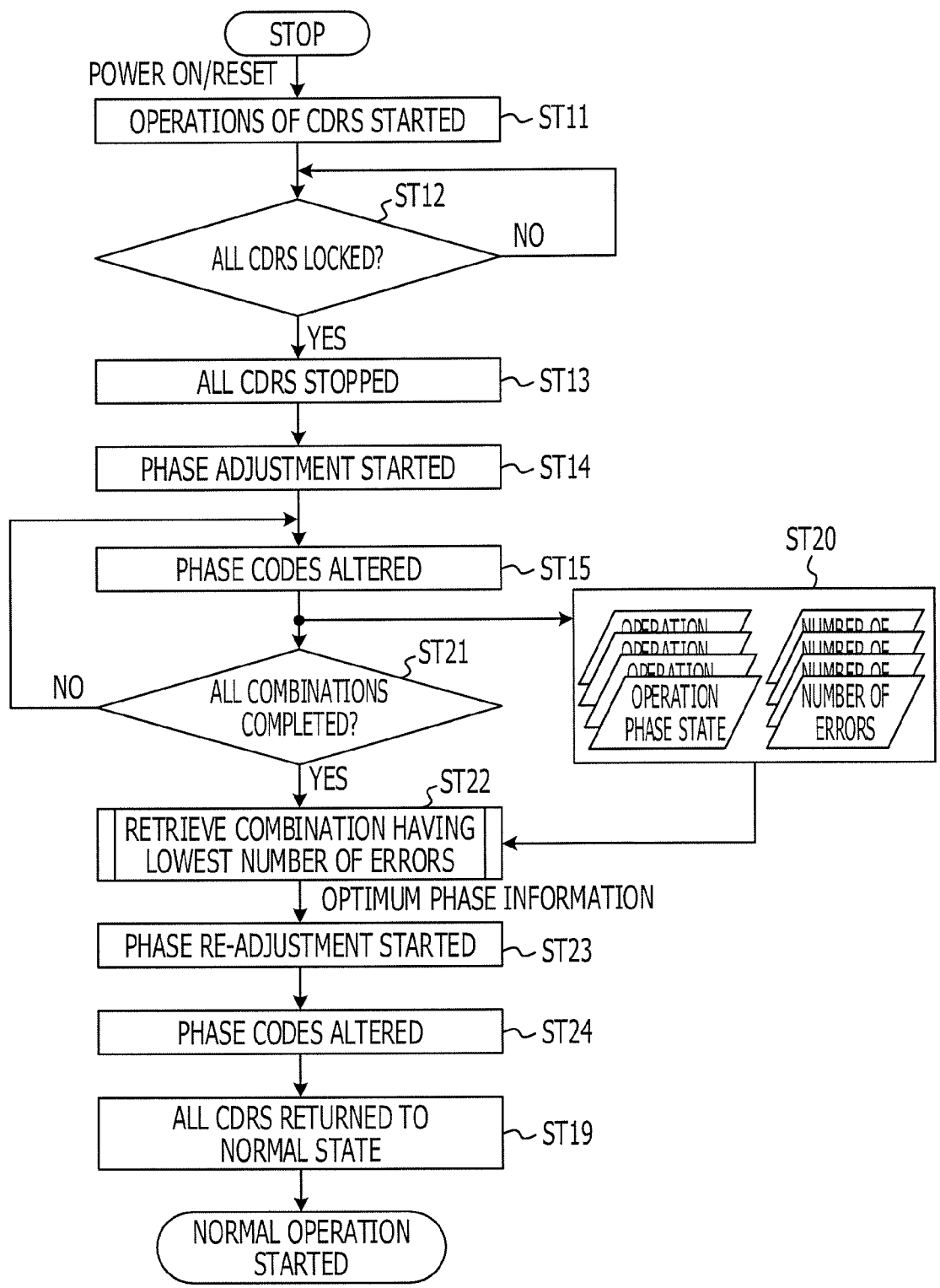
FIG. 15 is a flowchart for illustrating an example of the operation of the reception circuit depicted in FIG. 14.

FIG. 14 is a block diagram depicting a reception circuit of a second embodiment, and FIG. 15 is a flowchart for illustrating an example of the operation of the reception circuit depicted in FIG. 14.

As is apparent from a comparison between FIG. 14 and the aforementioned FIG. 8, the operation phase control circuit 1 in the second embodiment includes error detectors 13 and 14 instead of the phase detection circuits 11 and 12 of the operation phase control circuit 1 in the first embodiment.

In other words, in the second embodiment, rather than the phases of the frequency-divided clocks DIVCLK0 and DIVCLK1 being detected by the phase detection circuits 11 and 12 as in the first embodiment, errors in reception data Data0 [15:0] and Data1 [15:0] are detected by the error detectors 13 and 14 and control is performed.

The error detector 13 receives reception data Data0 [15:0] of the block circuit (CDR0) 100, and the error detector 14 receives reception data Data1 [15:0] from the block circuit (CDR1) 200.

Here, in the error detection performed by the error detector 13 (14), for example, the detection of a pseudo-random bit stream (PRBS) data stream (for example, "1, 0, 1, 0, . . . ") may be carried out; however, it is also possible for packet error detection to be carried out.

Furthermore, for example, if special coding is applied to the data stream such as 8B10B coding, it is also possible for the error detector 13 (14) to serve as a determination device that determines whether or not that coding is correct. Moreover, with 8B10B coding, "0s" and "1s" do not continue for more than five bits with respect to 8-bit data and low-frequency bands are suppressed.

In addition, it is also possible for the error detector 13 (14), for example, to be substituted by using information of error detection correction such as cyclic redundancy checks (CRCs) performed by the CPU.

Moreover, the configurations of the selector 105 (205), the gated clock circuit 106 (206), and the frequency lock detector 107 (207) and so forth are the same as in the first embodiment described with reference to FIG. 8, and descriptions thereof have been omitted.

As is apparent from a comparison between FIG. 15 and the aforementioned FIG. 9, in the second embodiment, steps ST11 to ST15 and ST19 are the same as in the first embodiment. In other words, in step ST11, the processing performed by the CDRs (block circuits 100 and 200) starts, and processing advances to step ST13 when, in step ST12, it is determined that a CDR lock has been performed by all of the block circuits 100 and 200.

In step ST13, when the operation phase control circuit 1 controls the gated clock circuits (operation control circuits) 106 and 206 by means of the control signals CS0 and CS1 and stops the digital filter circuits 103 and 203, processing advances to step ST14 and phase adjustment is started.

In addition, processing advances to step ST15, the operation phase control circuit 1 controls the selectors 105 and 205 by means of the control signals CS0 and CS1, and carries out phase adjustment by altering the phase codes output to the phase shifters 104 and 204.

Then, in step ST20, the error detector 13 (14) detects errors in the reception data Data0 [15:0] (Data1 [15:0]) of the block circuit 100 (200) and acquires the operation phase state, and processing advances to step ST21.

In step ST21, it is determined whether or not all of the combinations of the phase adjustments by the phase shifter 104 (204) that alters phase codes have been completed, and processing returns to step ST15 and the same processing is repeated until it is determined that all of the combinations have been completed.

Next, processing advances to step ST22, and the combination having the lowest number of errors is retrieved from among all of the combinations of the phase adjustments, and, in addition, processing advances to step ST23, phase re-adjustment is started in accordance with the information (optimum phase information) of that combination, and processing advances to step ST24.

Here, step ST23 and step ST24 correspond to step ST14 and step ST15; however, there is a difference in that, in step ST23 and step ST24, phase adjustment is performed by means of phase codes obtained by means of the optimum phase information of the combination having the lowest number of errors.

In this way, once phase re-adjustment is carried out in accordance with the optimum phase information of the combination having the lowest number of errors, processing advances to step ST19, and all of the CDRs are returned to a normal state. In other words, the reception operation of the reception circuit 3 (100 and 200) is started in a state in which the bit error rates in the reception data Data0 [15:0] and Data1 [15:0] of the block circuits 100 and 200 are the lowest.

Moreover, according to the aforementioned second embodiment, for example, phase control for clocks in the block circuits is carried out in such a way that the bit error rates are the lowest, even with regard to causes other than the transmission timings of frequency-divided clocks being coincident and simultaneous switching noise being generated.

Figure 16:
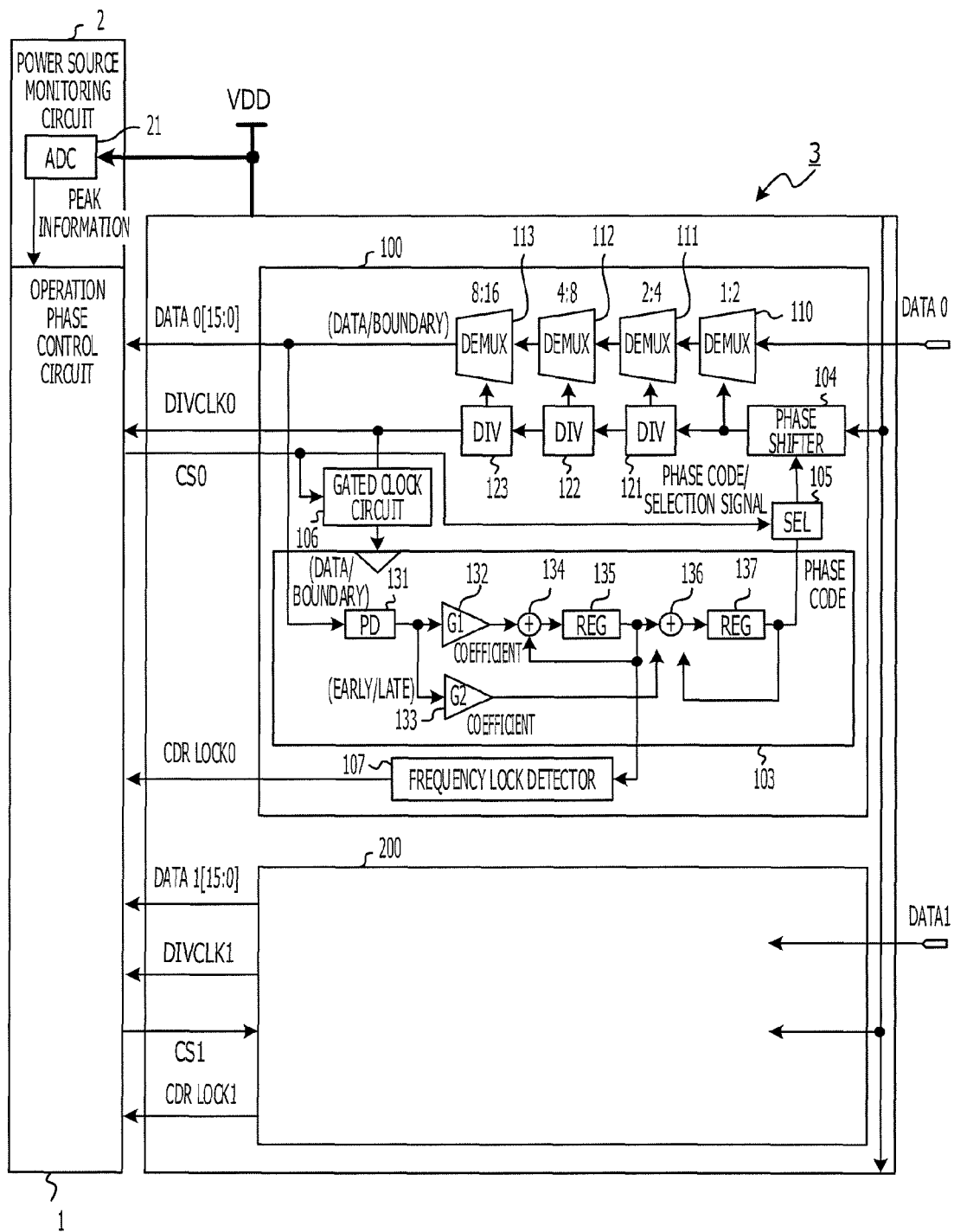
FIG. 16 is a block diagram depicting a reception circuit of a third embodiment.
Figure 17:
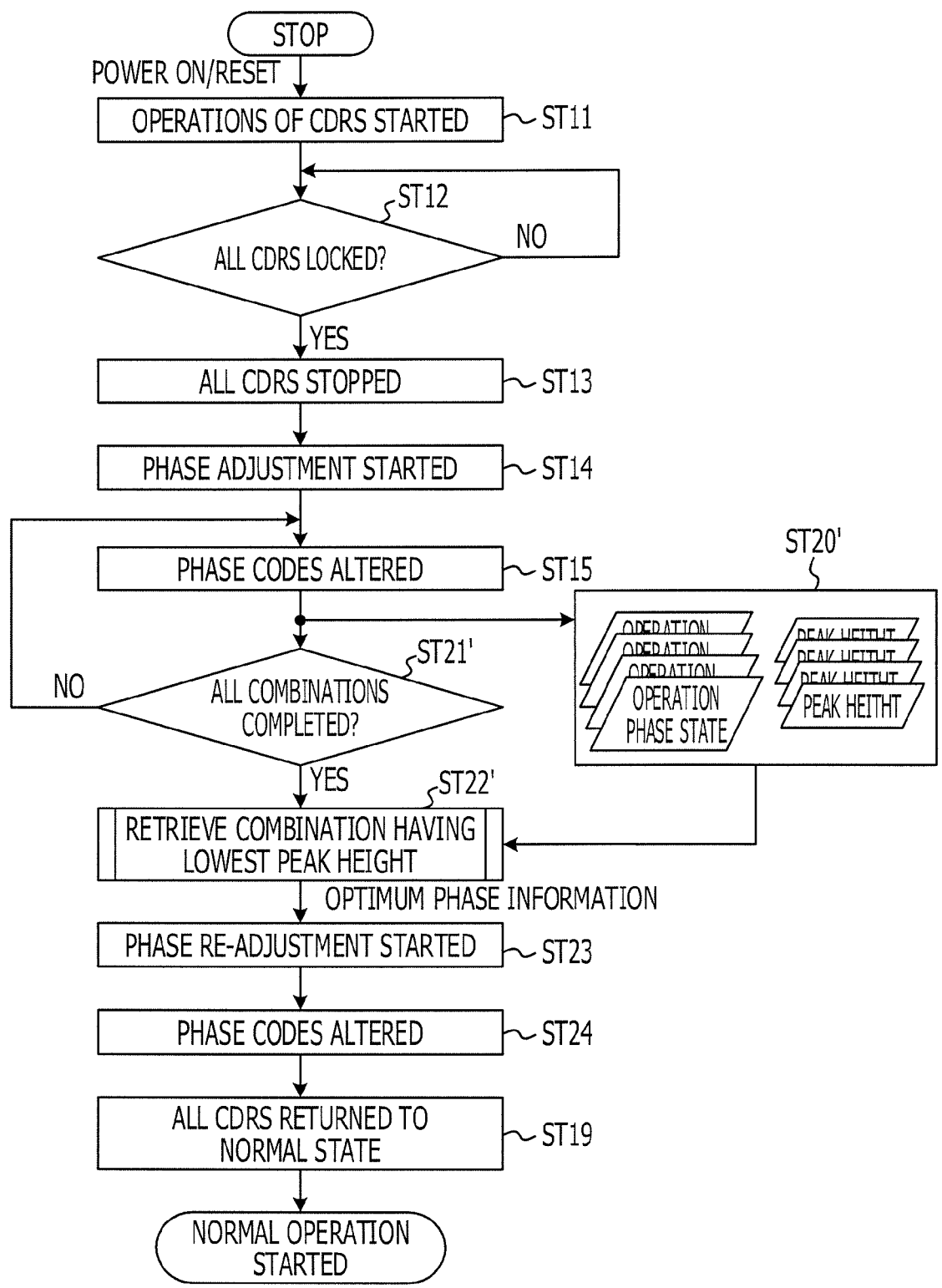
FIG. 17 is a flowchart for illustrating an example of the operation of the reception circuit depicted in FIG. 16.

FIG. 16 is a block diagram depicting a reception circuit of a third embodiment, and FIG. 17 is a flowchart for illustrating an example of the operation of the reception circuit depicted in FIG. 16.

As is apparent from a comparison between FIG. 16 and the aforementioned FIG. 8 and FIG. 14, in the third embodiment, the operation phase control circuit 1 does not include the phase detection circuits 11 and 12 of the first embodiment, or the error detectors 13 and 14 of the second embodiment.

Instead, the operation phase control circuit 1 receives an output signal from a power source monitoring circuit 2 that monitors a power source voltage Vdd applied to the reception circuit 3 (block circuits 100 and 200), and carries out phase control for clocks in the block circuits 100 and 200.

The power source monitoring circuit 2 includes an analog-digital converter (ADC) 21, and outputs, to the operation phase control circuit 1, a signal (peak information) obtained by subjecting the power source voltage Vdd applied to the reception circuit 3 to digital conversion. In other words, the power source voltage Vdd is monitored by means of the ADC 21, and the combination of operation phases having the least power source noise is selected.

Moreover, the control of the selector 105 (205) and the gated clock circuits 106 (206) performed by the operation phase control circuit 1 is the same as in the first and second embodiments.

As is apparent from a comparison between FIG. 17 and the aforementioned FIG. 15, in the third embodiment, the processing of steps ST20 to ST23 in the second embodiment is altered to the processing of steps ST20' to ST23'.

In other words, in contrast to the error detector 13 detecting errors in the reception data Data0[15:0] in step ST20 of the second embodiment, in step ST20' of the third embodiment, the ADC 21 detects the peak height (peak voltage) of the power source voltage Vdd and acquires the operation phase state.

In addition, in step ST21', it is determined whether or not all of the combinations of the phase adjustments by the phase shifter 104 that alters phase codes have been completed, and processing returns to step ST15 and the same processing is repeated until it is determined that all of the combinations have been completed.

Next, processing advances to step ST22', and the combination having the lowest peak height is retrieved from among all of the combinations of the phase adjustments, and, in addition, processing advances to step ST23, phase re-adjustment is started in accordance with the information (optimum phase information) of that combination, and processing advances to step ST24.

In this way, once phase re-adjustment is carried out in accordance with the optimum phase information of the combination having the lowest peak height for the power source voltage Vdd, processing advances to step ST19, and all of the CDRs are returned to a normal state. In other words, the reception operation of the reception circuit 3 (100 and 200) is started in a state in which the peak height for the power source voltage Vdd is the lowest.

Moreover, according to the aforementioned third embodiment, for example, phase control for clocks in the block circuits is carried out in such a way that the peak height for the power source voltage Vdd is the lowest, even with regard to causes other than the transmission timings of frequency-divided clocks being coincident and simultaneous switching noise being generated.

Figure 18A:
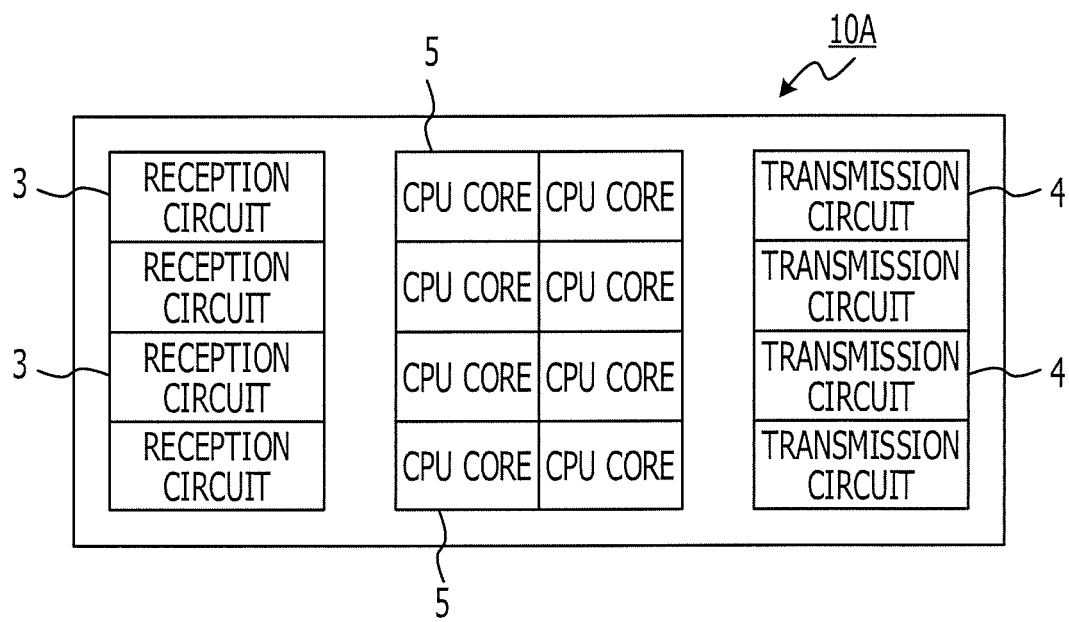
FIG. 18A and FIG. 18B are block diagrams depicting examples of a semiconductor integrated circuit device in which a reception circuit of a present embodiment is applied.
Figure 18B:
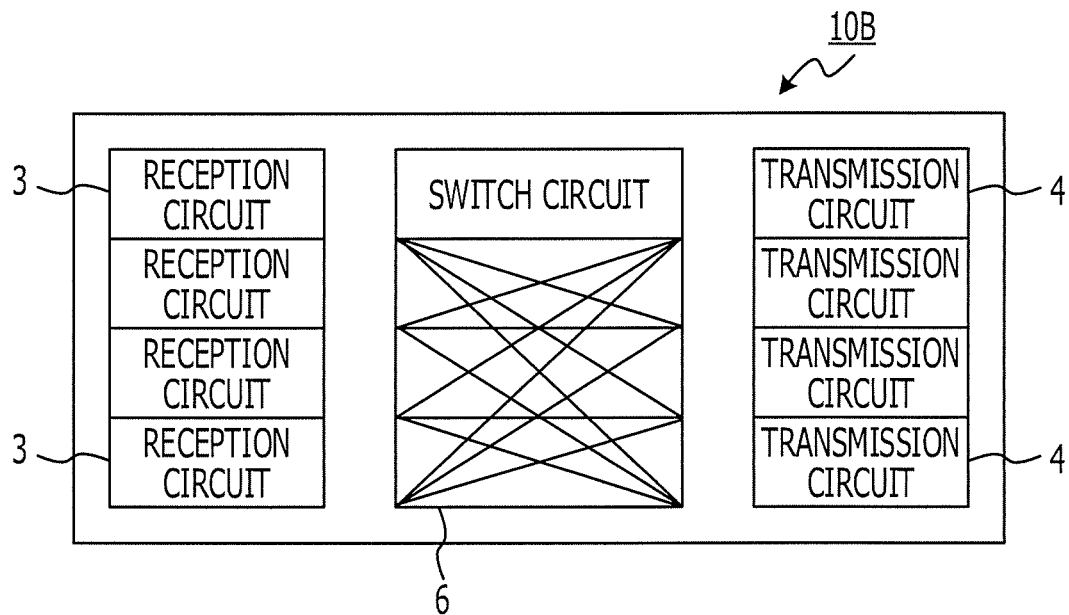

FIG. 18A and FIG. 18B are block diagrams depicting examples of a semiconductor integrated circuit device in which a reception circuit of a present embodiment is applied, FIG. 18A depicts an example of a multi-CPU chip, and FIG. 18B depicts an example of a crossbar switch chip.

As depicted in FIG. 18A, a multi-CPU chip 10A, for example, includes a plurality of reception circuits 3, a plurality of CPU cores 5, and a plurality of transmission circuits 4. Furthermore, as depicted in FIG. 18B, the crossbar switch chip 10B includes a plurality of reception circuits 3, a plurality of switch circuits 6, and a plurality of transmission circuits 4.

In other words, a reception circuit 3 (block circuits 100 to 400) of the aforementioned present embodiments, for example, together with the transmission circuits 600 and 700, may not only be applied in the I/O circuit described with reference to FIG. 1, but may also be applied as a multi-CPU chip 10A and a crossbar switch chip 10B.

In addition, the multi-CPU chip and the crossbar switch chip are also merely examples, and it is possible for a reception circuit of the present embodiments to be applied in various semiconductor integrated circuit devices (semiconductor chips).

FIG. 19 is a drawing for illustrating an example in which a semiconductor integrated circuit device depicted in FIG. 18A or FIG. 18B is applied. As depicted in FIG. 19, for example, a semiconductor chip 10 such as a multi-CPU chip or a crossbar switch chip is mounted on a circuit board 20, and this kind of circuit board 20 is, for example, used as one circuit board 20 in a server 30. In addition, for example, a plurality of servers 30 is mounted in a server rack 40.

In this way, a reception circuit and a semiconductor integrated circuit device of the present embodiments may be broadly applied with respect to various subjects.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A reception circuit comprising:
a plurality of block circuits, each block circuit including: a phase control circuit that controls a phase of a first clock, and a plurality of internal circuits that are driven by a second clock generated based on the phase-controlled first clock; and
an operation phase control circuit configured to include a phase detecting circuit that detects a phase of the second clock in each of the block circuits, and control the phase control circuit in each of the block circuits in such a way that the phases of the second clocks in the block circuits vary,
wherein each of the block circuits comprises a clock data recovery circuit, each of the internal circuits comprises a demultiplexer, and the second clock comprises a frequency-divided clock obtained by frequency-dividing the phase-controlled first clock; and
wherein each of the clock data recovery circuits comprises:
a digital filter circuit configured to adjust a sampling timing between an input data signal and the frequency-divided clock;
an operation control circuit configured to control an operation of the digital filter circuit in accordance with a control signal from the operation phase control circuit; and
a frequency lock detector configured to detect whether a frequency of the frequency-divided clock has been locked by the digital filter circuit.

2. The reception circuit according to claim 1, wherein the phase control circuit in each of the block circuits is controlled by a control signal from the operation phase control circuit so as to decrease an error rate for reception data due to the plurality of block circuits.

3. The reception circuit according to claim 1, wherein the operation phase control circuit includes an error detector that detects a bit error in output data in each of the block circuits, and obtains a combination of the phases of the second clocks in the block circuits, with which there are fewer detected bit errors in the output data in each of the block circuits, and controls the phase control circuit in each of the block circuits in accordance with said combination.

4. A reception circuit comprising:
a plurality of block circuits, each block circuit including:
a phase control circuit that controls a phase of a first clock; and
a plurality of internal circuits that are driven by a second clock generated based on the phase-controlled first clock; and
an operation phase control circuit includes a power source monitoring circuit that monitors a peak of a power source voltage in the plurality of block circuits, and obtains a combination of the phases of the second clocks in the block circuits, with which the detected peak of the power source voltage in the plurality of block circuits decreases, and controls the phase control circuit in each of the block circuits in accordance with said combination.

5. A semiconductor integrated circuit device comprising:
a plurality of block circuits, each block circuit including: a phase control circuit that receives and performs phase control for a first clock, and a plurality of internal circuits that are driven by a second clock generated based on the phase-controlled first clock; and
an operation phase control circuit configured to:
include a phase detection circuit that detects a phase of the second clock in each of the block circuits, and
control the phase control circuit in each of the block circuits in such a way that the phases of the second clocks in the block circuits vary,
wherein each of the block circuits comprises a clock data recovery circuit, each of the internal circuits comprises a demultiplexer, and the second clock comprises a frequency-divided clock obtained by frequency-dividing the phase-controlled first clock; and
wherein each of the clock data recovery circuits comprises:
a digital filter circuit configured to adjust a sampling timing between an input data signal and the frequency-divided clock;
an operation control circuit configured to control an operation of the digital filter circuit in accordance with a control signal from the operation phase control circuit; and
a frequency lock detector configured to detect whether a frequency of the frequency-divided clock has been locked by the digital filter circuit.

6. The semiconductor integrated circuit device according to claim 5, wherein the operation phase control circuit is configured to control the phase control circuit in each of the block circuits so as to decrease a bit error rate in an output signal of the plurality of block circuits.

7. The semiconductor integrated circuit device according to claim 5, wherein the operation phase control circuit includes an error detector that detects a bit error in output data in each of the block circuits, and obtains a combination of the phases of the second clocks in the block circuits, with which there are fewer detected bit errors in the output data in each of the block circuits, and controls the phase control circuit in each of the block circuits in accordance with said combination.

8. The semiconductor integrated circuit device according to claim 5, further comprising a clock generator that generates the first clock.

9. The semiconductor integrated circuit device according to claim 5, wherein the control of the phase control circuit in each of the block circuits performed by the operation phase control circuit is performed as initialization processing when power is supplied to the semiconductor integrated circuit device, or as reset processing.

10. A semiconductor integrated circuit device comprising:
a plurality of block circuits, each block circuit including: a phase control circuit that receives and performs phase control for a first clock, and a plurality of internal circuits that are driven by a second clock generated based on the phase-controlled first clock; and
an operation phase control circuit includes a power source monitoring circuit that monitors a peak of a power source voltage in the plurality of block circuits, and obtains a combination of the phases of the second clocks in the block circuits, with which the detected peak of the power source voltage in the plurality of block circuits decreases, and controls the phase control circuit in each of the block circuits in accordance with said combination.

* * * * *